(12) United States Patent
Chen et al.

(10) Patent No.: US 10,854,681 B2
(45) Date of Patent: Dec. 1, 2020

(54) DISPLAY DEVICE

(71) Applicant: Au Optronics Corporation, Hsinchu (TW)

(72) Inventors: Yung-Chih Chen, Taichung (TW); Chun-Hsin Liu, Yunlin County (TW); Li-Chih Hsu, Taipei (TW); Tsung-Ying Ke, Tainan (TW); Wan-Tsang Wang, Hsinchu (TW); Keh-Long Hwu, Hsinchu County (TW); Ya-Ting Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/411,160

(22) Filed: May 14, 2019

(65) Prior Publication Data

US 2020/0119104 A1    Apr. 16, 2020

(30) Foreign Application Priority Data

Oct. 15, 2018 (TW) .............................. 107136157 A

(51) Int. Cl.
*H01L 27/32* (2006.01)
*G09G 3/3225* (2016.01)

(52) U.S. Cl.
CPC ........ *H01L 27/3211* (2013.01); *G09G 3/3225* (2013.01); *G09G 2310/0264* (2013.01)

(58) Field of Classification Search
CPC .............. H01L 27/3211; G09G 3/3225; G09G 2310/0264
See application file for complete search history.

(56) References Cited

U.S. PATENT DOCUMENTS

| 2002/0154259 A1* | 10/2002 | Freidhoff | ............ H01L 27/3293 349/73 |
| 2008/0224271 A1* | 9/2008 | Sogawa | ............ H01L 21/76898 257/621 |
| 2014/0063393 A1* | 3/2014 | Zhong | .................... H01L 25/18 349/42 |

(Continued)

FOREIGN PATENT DOCUMENTS

| CN | 106773384 | 5/2017 |
| CN | 107623023 | 1/2018 |
| CN | 108511487 | 9/2018 |

OTHER PUBLICATIONS

Yim (Yim et al. "Anisotropic conductive films (ACFs) for ultra-fine pitch Chip-On-Glass (COG) applications", International Journal of Adhesion & Adhesives 27 (2007) 77-84, https://doi.org/10.1016/j.ijadhadh.2005.12.006) (Year: 2007).*

*Primary Examiner* — Mark Edwards
(74) *Attorney, Agent, or Firm* — JCIPRNET

(57) ABSTRACT

A display device includes a pixel circuit substrate, a plurality of light emitting devices, a driver circuit substrate, a plurality of connection terminals, and an electrically conductive adhesion layer. The light emitting devices are electrically connected to the pixel circuit substrate. The driver circuit substrate is disposed on a back side of the pixel circuit substrate. The connection terminals electrically connect the driver circuit substrate to the pixel circuit substrate. The electrically conductive adhesion layer is disposed between the pixel circuit substrate and the driver circuit substrate.

7 Claims, 6 Drawing Sheets

(56) References Cited

U.S. PATENT DOCUMENTS

| | | | |
|---|---|---|---|
| 2016/0013442 A1* | 1/2016 | Akimoto | H01L 27/3276 |
| | | | 257/59 |
| 2016/0329386 A1* | 11/2016 | Sauers | H01L 51/56 |
| 2017/0132976 A1* | 5/2017 | Yang | G09G 3/2003 |
| 2017/0294496 A1* | 10/2017 | Wang | H01L 27/3253 |
| 2018/0210265 A1 | 7/2018 | Wang et al. | |
| 2018/0247994 A1 | 8/2018 | Seo et al. | |
| 2018/0366065 A1* | 12/2018 | Yang | G09G 3/20 |

\* cited by examiner

DISPLAY DEVICE

CROSS-REFERENCE TO RELATED APPLICATION

This application claims the priority benefit of Taiwan application serial no. 107136157, filed on Oct. 15, 2018. The entirety of the above-mentioned patent application is hereby incorporated by reference herein and made a part of this specification.

BACKGROUND

Technical Field

The disclosure relates to a display device, and more particularly, to a display device including a pixel circuit substrate and a driver circuit substrate.

Related Art

In an existing display device, a peripheral area for disposing a driver circuit is provided around a display area, and the peripheral area where the driver circuit is disposed does not have a function of displaying an image. In general, a frame is used to cover the peripheral area that cannot display an image. However, the frame tends to make the display device look cumbersome. In addition, when a plurality of display devices need to be spliced together to form a larger screen, the frame may cause the displayed screen to become clearly discontinuous.

SUMMARY

The disclosure provides a display device with advantages of a narrow border.

At least one embodiment of the disclosure provides a display device including a pixel circuit substrate, a plurality of light emitting devices, a driver circuit substrate, a plurality of connection terminals and an electrically conductive adhesion layer. The light emitting devices are electrically connected to the pixel circuit substrate. The driver circuit substrate is located on a back side of the pixel circuit substrate. The connection terminals electrically connect the driver circuit substrate to the pixel circuit substrate. The electrically conductive adhesion layer is located between the pixel circuit substrate and the driver circuit substrate.

To make the above features and advantages of the disclosure more comprehensible, examples accompanied with drawings are described in detail as follows.

DESCRIPTION OF THE EMBODIMENTS

Figure 1A:
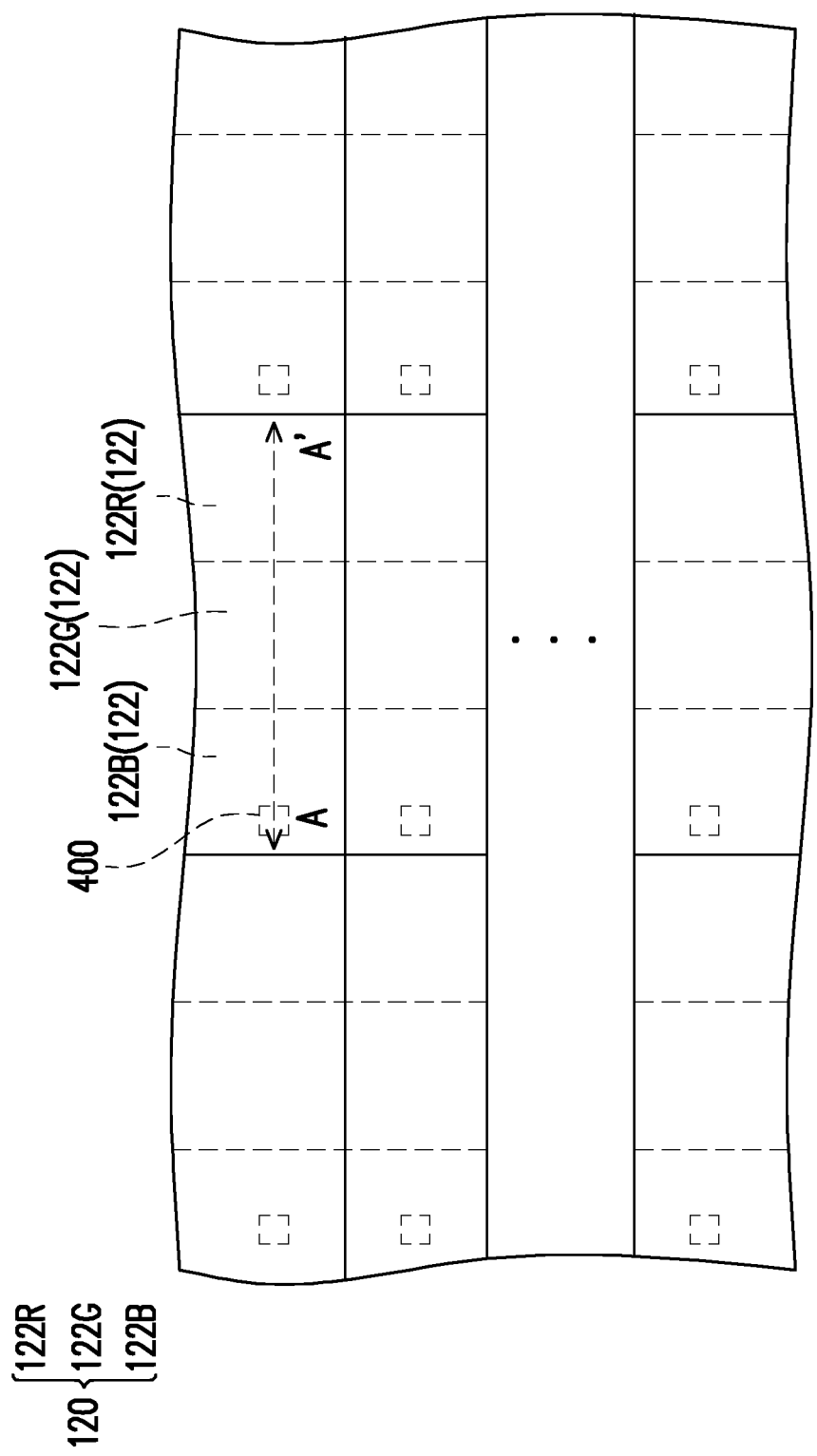
FIG. 1A is a schematic top view of a pixel circuit substrate of a display device according to an embodiment of the disclosure.
Figure 1B:
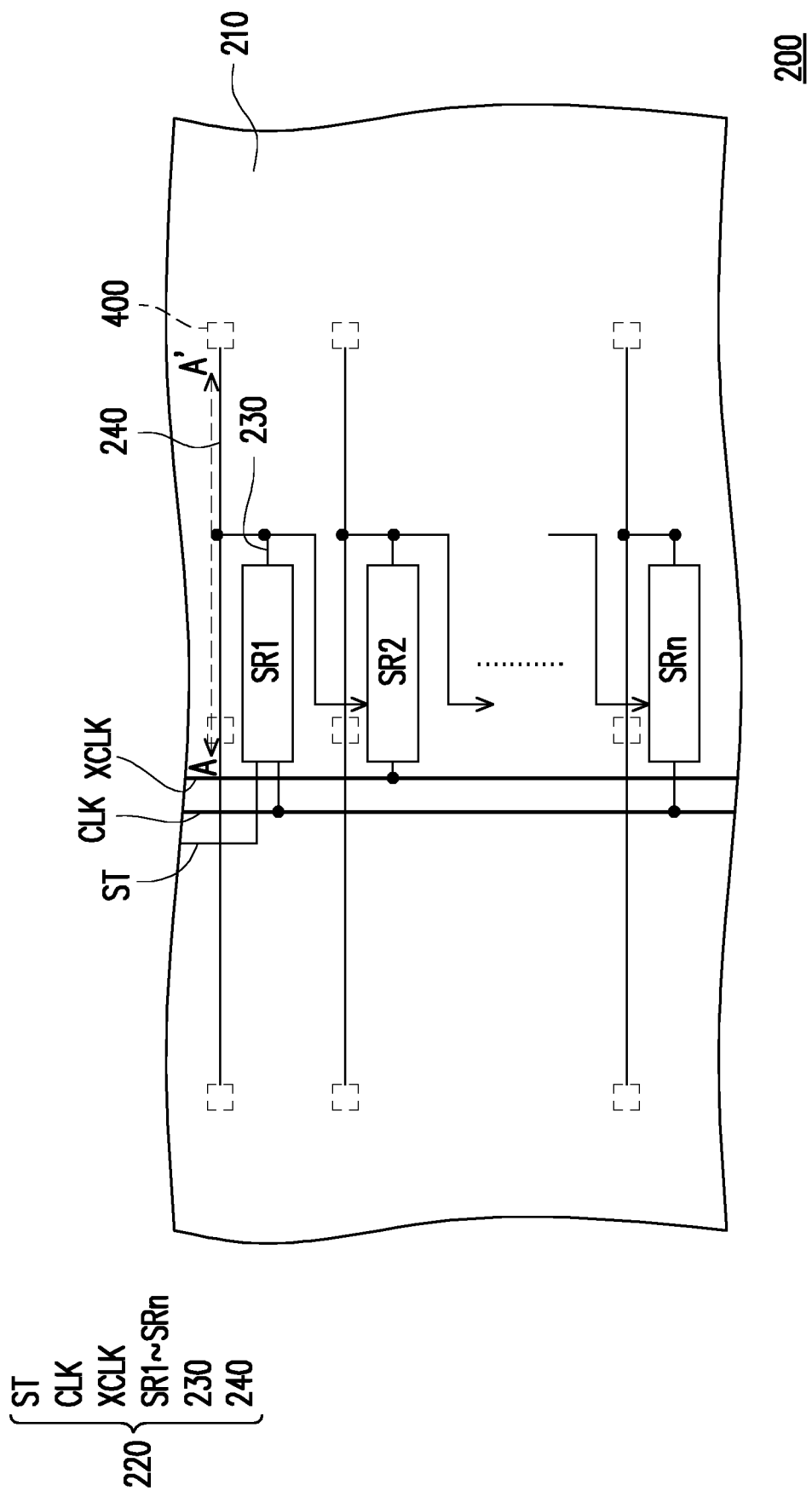
FIG. 1B is a schematic top view of a driver circuit substrate of a display device according to an embodiment of the disclosure.
Figure 1C:
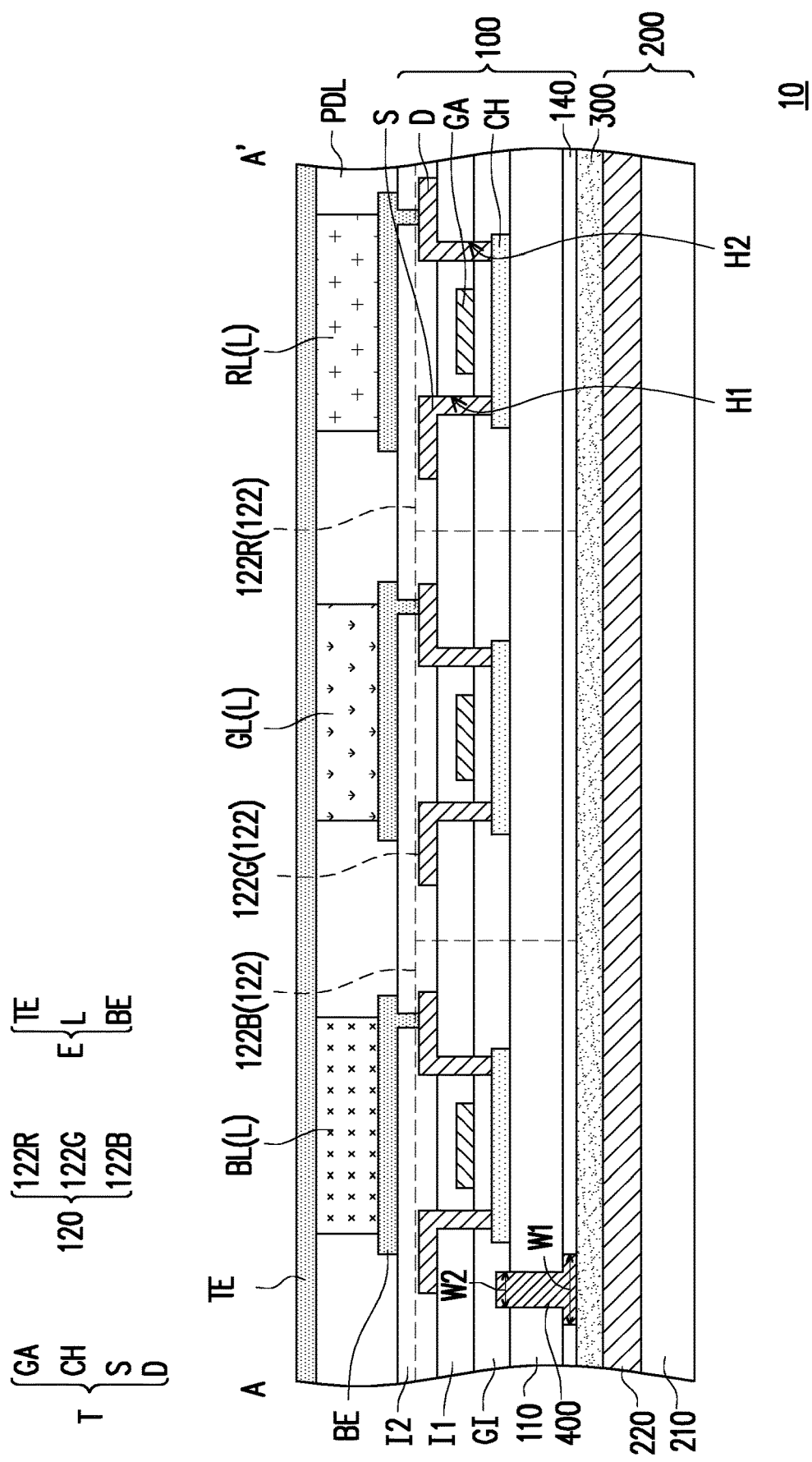
FIG. 1C is a schematic cross-sectional view of a display device according to an embodiment of the disclosure.

FIG. 1A is a schematic top view of a pixel circuit substrate of a display device according to an embodiment of the disclosure. FIG. 1B is a schematic top view of a driver circuit substrate of a display device according to an embodiment of the disclosure. FIG. 1C is a schematic cross-sectional view of a display device according to an embodiment of the disclosure. FIG. 1C corresponds to a section line AN in FIG. 1A and FIG. 1B. To facilitate the explanation, FIG. 1A illustrates positions on a pixel circuit substrate 100 corresponding to connection terminals 400, and FIG. 1B illustrates positions on a driver circuit substrate 200 corresponding to the connection terminals 400.

Referring to FIG. 1A to FIG. 1C, a display device 10 includes the pixel circuit substrate 100, a plurality of light emitting devices E, the driver circuit substrate 200, an electrically conductive adhesion layer 300, and a plurality of the connection terminals 400. The driver circuit substrate 200 is located on a back side of the pixel circuit substrate 100. The electrically conductive adhesion layer 300 is located between the pixel circuit substrate 100 and the driver circuit substrate 200.

The pixel circuit substrate 100 includes a first substrate 110 and a plurality of pixel circuits 120.

A material of the first substrate 110 may be glass, quartz, an organic polymer, or an opaque/reflective material (e.g., an electrically conductive material, metal, wafer, ceramic, or other applicable material), or other applicable material. If an electrically conductive material or metal is used, the first substrate 110 is covered with an insulating layer (not shown) to avoid a short circuit.

The pixel circuits 120 are located on the first substrate 110 and are arranged in a plurality of columns and a plurality of rows. In the present embodiment, each of the pixel circuits 120 includes a plurality of sub-pixel circuits 122, and each of the sub-pixel circuits 122 includes an active device T and other wires (e.g., scan lines and data lines). Although in FIG. 1A, an example is given in which the sub-pixel circuits 122 in each of the pixel circuits 120 are horizontally arranged and are of a rectangular shape of the same size, the disclosure is not limited thereto. In other embodiments, the sub-pixel circuits 122 in each of the pixel circuits 120 may be arranged in other manners, and the sub-pixel circuits 122 in each of the pixel circuits 120 may be of different sizes.

The active device T includes a channel layer CH, a gate GA, a source S and a drain D.

The gate GA overlaps the channel layer CH, and a gate insulating layer GI is sandwiched between the gate GA and the channel layer CH. A first insulating layer I1 covers the gate GA. The source S and the drain D are located on the first insulating layer I1, and are electrically connected to the channel layer CH via opening H1 and H2, respectively. The openings H1 and H2 at least penetrate the first insulating layer I1. In the present embodiment, the openings H1 and H2 penetrate the gate insulating layer GI and the first insulating layer I1. In the present embodiment, the gate GA is electrically connected to a scan line (not shown), and the source S is electrically connected to a data line (not shown). In some embodiments, the gates GA of the active devices T of the sub-pixel circuits 122 in the same row are electrically connected to the same scan line, and the sources S of the active devices T of the sub-pixel circuits 122 in the same column are electrically connected to the same data line. However, the disclosure is not limited thereto.

A second insulating layer I2 covers the first insulating layer I1. The light emitting device E includes a bottom electrode BE, a light emitting layer L and a top electrode TE. The bottom electrode BE is located on the second insulating layer I2 and is electrically connected to the drain D. A pixel definition layer PDL is located on the second insulating layer I2. The light emitting layer L is located on the bottom electrode BE and is located in the pixel definition layer PDL. The top electrode TE is located on the light emitting layer L.

In the present embodiment, the light emitting layer L includes a blue light emitting layer BL, a red light emitting layer RL, a green light emitting layer GL, and/or a light emitting layer of other color. In other words, the sub-pixel circuit 122 includes a blue sub-pixel circuit 122B, a red sub-pixel circuit 122R, a green sub-pixel circuit 122G, and/or sub-pixels of other colors.

In the present embodiment, the light emitting device E is, for example, an organic light emitting diode. However, the disclosure is not limited thereto. In other embodiments, the light emitting device E may be an inorganic light emitting diode or other light emitting device.

The pixel circuit 120 is electrically connected to the connection terminal 400. The connection terminal 400 penetrates the first substrate 110. In the present embodiment, the connection terminal 400 is located in the blue sub-pixel circuit 122B, thereby reducing adverse effects of the connection terminal 400 on display quality.

In the present embodiment, the pixel circuit substrate 100 further includes a buffer layer 140. The buffer layer 140 is located between the first substrate 110 and the electrically conductive adhesion layer 300. The connection terminal 400 penetrates the buffer layer 140. A width W1 of the connection terminal 400 in the buffer layer 140 is larger than a width W2 of the connection terminal 400 in the first substrate 110, thereby enabling the pixel circuit substrate 100 to be more effectively electrically connected to the driver circuit substrate 200.

The connection terminal 400 electrically connects the driver circuit substrate 200 to the pixel circuit substrate 100. In the present embodiment, the driver circuit substrate 200 is electrically connected to the pixel circuit substrate 110 via the electrically conductive adhesion layer 300 and the connection terminal 400. In some embodiments, the electrically conductive adhesion layer 300 may wholly cover the driver circuit substrate 200 or partially cover the driver circuit substrate 200. For example, the electrically conductive adhesion layer 300 may be disposed only corresponding to the connection terminal 400, and a width of the electrically conductive adhesion layer 300 is larger than or equal to the width W1 of the connection terminal 400. The electrically conductive adhesion layer 300 includes, for example, an anisotropic conductive film, a solder material, or other material that can be used for electrical conduction and connection.

The driver circuit substrate 200 includes a second substrate 210 and a driver circuit 220. The driver circuit 220 is located on the second substrate 210.

A material of the second substrate 210 may be glass, quartz, an organic polymer, or an opaque/reflective material (e.g., an electrically conductive material, metal, wafer, ceramic, or other applicable material), or other applicable material. If an electrically conductive material or metal is used, the second substrate 210 is covered with an insulating layer (not shown) to avoid a short circuit.

In the present embodiment, the driver circuit 220 includes a plurality of driving units SR1 to SRn, a signal line ST, a signal line CLK, a signal line XCLK, an output line 230 and a connection line 240. To facilitate the explanation, the driver circuit 220 in FIG. 1C is shown to have only a single layer, and detailed components are omitted.

In the present embodiment, the signal line ST is electrically connected to the driving unit SR1. Some of the driving units SR1 to SRn are electrically connected to the signal line CLK, and the others are electrically connected to the signal line XCLK. In the present embodiment, a driving unit SRn−1 (not shown in FIG. 1B) is electrically connected to the driving unit SRn via the output line 230. For example, the driving unit SR1 is electrically connected to the driving unit SR2 via the output line 230.

The driving units SR1 to SRn transmit a signal to the connection terminal 400 in the pixel circuit substrate 110 through the output line 230 and the connection line 240. In the present embodiment, a plurality of the connection terminals 400 electrically connected to the pixel circuits 120 in the same row are disposed corresponding to one of the driving units SR1 to SRn. In other words, each row of the pixel circuits 120 is disposed corresponding to one of the driving units SR1 to SRn. For example, the driving unit SR1 is electrically connected to the pixel circuits 120 in a first row via the connection terminals 400, the driving unit SR2 is electrically connected to the pixel circuits 120 in a second row via the connection terminals 400, and the driving unit SRn is electrically connected to the pixel circuits 120 in an n-th row via the connection terminals 400. The number of the connection terminals 400 electrically connected to the pixel circuits 120 in the same row may be adjusted according to actual needs.

In some embodiments, the driving units SR1 to SRn are gate driver circuits, and the pixel circuits 120 in each row are electrically connected to the same scan line. The scan line connected to the pixel circuits 120 in each row is driven by a corresponding one of the driving units SR1 to SRn.

Based on the above, the driver circuit substrate 200 of the display device 10 is located on the back side of the pixel circuit substrate 100, thereby allowing the display device 10 to have advantages of a narrow border or even no border. In addition, since the pixel circuit 120 and the driver circuit 220 in the present embodiment are respectively fabricated on the first substrate 110 and the second substrate 210, the difficulty of manufacturing the display device 10 can be reduced.

Figure 2:
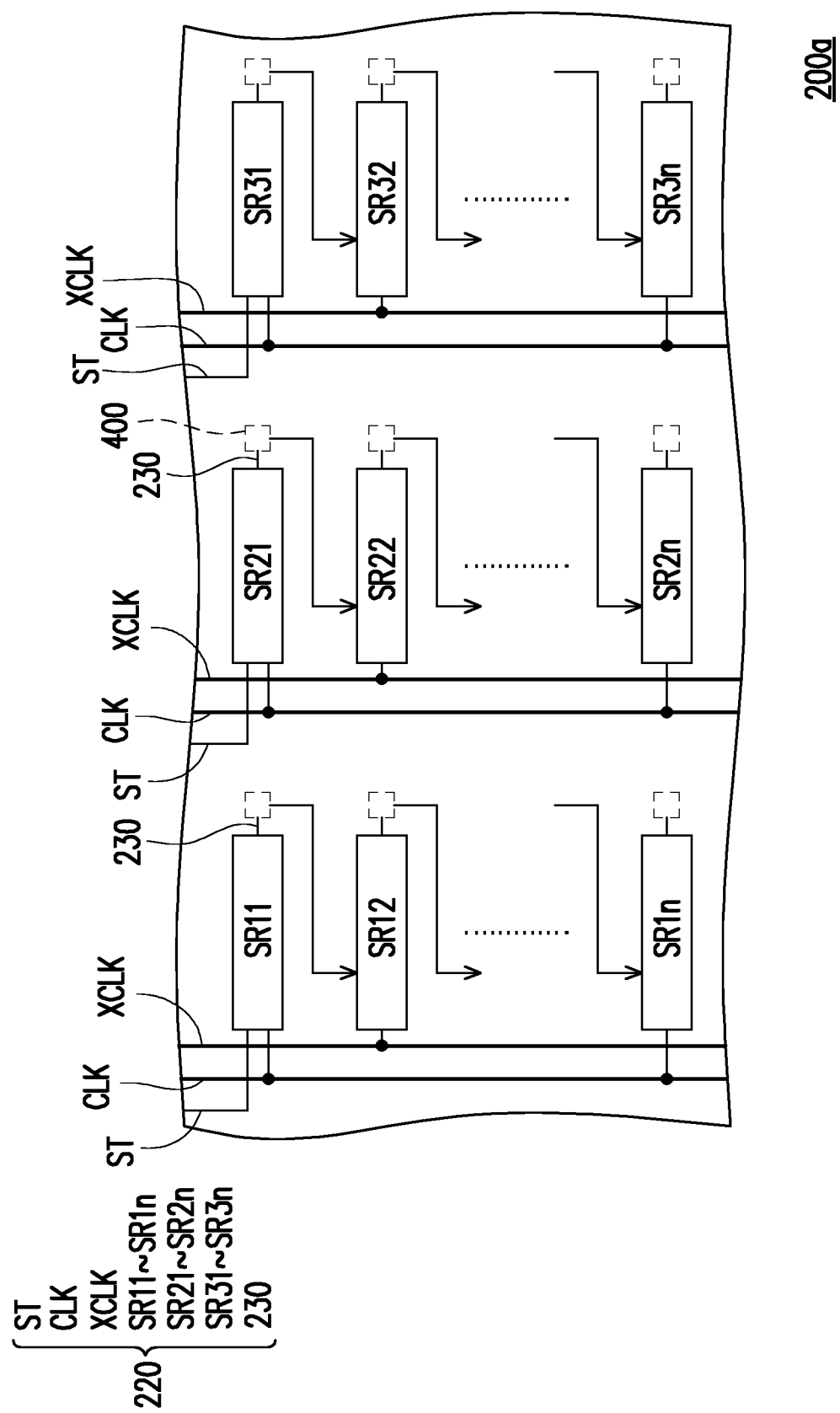
FIG. 2 is a schematic top view of a driver circuit substrate of a display device according to an embodiment of the disclosure.

FIG. 2 is a schematic top view of a driver circuit substrate of a display device according to an embodiment of the disclosure. It should be noted that the reference numerals and a part of the content of the embodiment of FIG. 1A to FIG. 1C are used in the embodiment of FIG. 2, in which the same or similar reference numerals denote the same or similar elements, and repeated description of the same technical content is omitted. For the description of the omitted parts, reference can be found in the aforementioned embodiment and the description will not be repeated here.

A main difference between a driver circuit substrate 200a of FIG. 2 and the driver circuit substrate 200 of FIG. 1B lies in that, the driver circuit substrate 200a includes driving units SR11 to SR1n, driving units SR21 to SR2n, and driving units SR31 to SR3n, and one or more of the driving units correspond to pixels in the same row.

Referring to FIG. 1A and FIG. 2, the driver circuit 220 includes the driving units SR11 to SR1n, the driving units SR21 to SR2n, the driving units SR31 to SR3n, the signal line ST, the signal line CLK, the signal line XCLK and the output line 230. A plurality of the connection terminals 400 electrically connected to the pixel circuits 120 in the same row are disposed corresponding to more than one of the driving units. Each row of the pixel circuits 120 is disposed corresponding to one or more of the driving units. Each row of the pixel circuits 120 corresponds to one of the driving units SR11 to SR1n, one of the driving units SR21 to SR2n, and one of the driving units SR31 to SR3n. For example, the driving unit SR11, the driving unit SR21 and the driving unit SR31 are respectively electrically connected to the pixel circuits 120 in the first row via the connection terminals 400, the driving unit SR12, the driving unit SR22 and the driving unit SR32 are respectively electrically connected to the pixel circuits 120 in the second row via the connection terminals 400, and the driving unit SR1n, the driving unit SR2n and the driving unit SR3n are respectively electrically connected to the pixel circuits 120 in the n-th row via the connection terminals 400. The number of the driving units corresponding to the pixel circuits 120 in the same row may be adjusted according to actual needs.

In the present embodiment, the driving units corresponding to the pixel circuits 120 in the same row generate the same driving signal (e.g., a gate driving signal). For example, the driving unit SR11, the driving unit SR21 and the driving unit SR31 generate the same signal and are electrically connected to the same scan line. The driving unit SR12, the driving unit SR22 and the driving unit SR32 generate the same signal and are electrically connected to the same scan line. The driving unit SR1n, the driving unit SR2n and the driving unit SR3n generate the same signal and are electrically connected to the same scan line.

Based on the above, since each row of the pixel circuits 120 is disposed corresponding to one or more of the driving units, signal distribution on the pixel circuits 120 in the same row becomes more uniform, and nonuniform signal distribution is less likely to occur.

Figure 3:
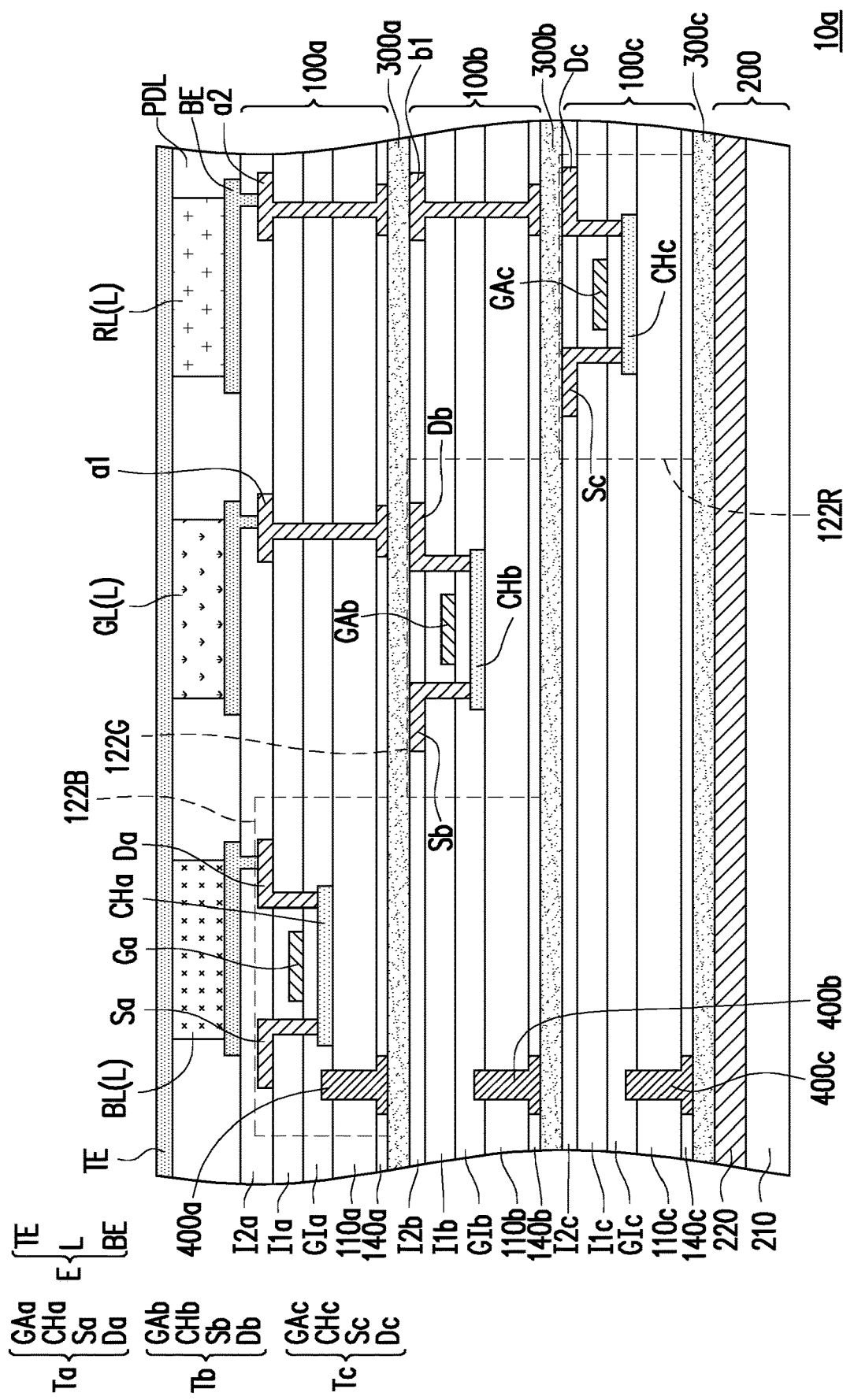
FIG. 3 is a schematic cross-sectional view of a display device according to an embodiment of the disclosure.

FIG. 3 is a schematic cross-sectional view of a display device according to an embodiment of the disclosure. It should be noted that the reference numerals and a part of the content of the embodiment of FIG. 1A to FIG. 1C are used in the embodiment of FIG. 3, in which the same or similar reference numerals denote the same or similar elements, and repeated description of the same technical content is omitted. For the description of the omitted parts, reference can be found in the aforementioned embodiment and the description will not be repeated here.

A main difference between a display device 10a of FIG. 3 and the display device 10 of FIG. 1C lies in that, the display device 10a includes a plurality of pixel circuit substrates (e.g., a pixel circuit substrate 100a, a pixel circuit substrate 100b and a pixel circuit substrate 100c).

Referring to FIG. 3, the pixel circuit substrate 100a, the pixel circuit substrate 100b and the pixel circuit substrate 100c overlap each other. A connection terminal 400a is located in the pixel circuit substrate 100a, and the pixel circuit substrate 100a is electrically connected to the pixel circuit substrate 100b via an electrically conductive adhesion layer 300a and the connection terminal 400a. A connection terminal 400b is located in the pixel circuit substrate 100b, and the pixel circuit substrate 100b is electrically connected to the pixel circuit substrate 100c via an electrically conductive adhesion layer 300b and the connection terminal 400b. A connection terminal 400c is located in the pixel circuit substrate 100c, and the pixel circuit substrate 100c is electrically connected to the driver circuit substrate 200 via an electrically conductive adhesion layer 300c and the connection terminal 400c. In the present embodiment, the pixel circuit substrate 100a, the pixel circuit substrate 100b and the pixel circuit substrate 100c are all electrically connected to the driver circuit substrate 200. The driver circuit substrate 200 is used to drive the pixel circuit substrate 100a, the pixel circuit substrate 100b and the pixel circuit substrate 100c.

The pixel circuit substrate 100a includes a first substrate 110a, the blue sub-pixel circuit 122B, an electrically conductive structure a1 and an electrically conductive structure a2. The blue sub-pixel circuit 122B is located on the first substrate 110a.

In the present embodiment, the blue sub-pixel circuit 122B includes an active device Ta and other wires (e.g., scan lines and data lines).

The active device Ta includes a channel layer CHa, a gate GAa, a source Sa and a drain Da.

The gate GAa overlaps the channel layer CHa, and a gate insulating layer GIa is sandwiched between the gate GAa and the channel layer CHa. A first insulating layer I1a covers the gate GAa. The source Sa and the drain Da are located on the first insulating layer I1a and are electrically connected to the channel layer CHa. In the present embodiment, the gate GAa is electrically connected to a scan line (not shown), and the source Sa is electrically connected to a data line (not shown). A second insulating layer I2a covers the first insulating layer I1a.

In the present embodiment, the blue light emitting layer BL is electrically connected to the active device Ta. The red light emitting layer RL and the green light emitting layer GL are electrically connected to the electrically conductive structure a2 and the electrically conductive structure a1, respectively. An active device for controlling the red light emitting layer RL and the green light emitting layer GL is not located in the pixel circuit substrate 100a.

In the present embodiment, the pixel circuit substrate 100a further includes a buffer layer 140a. The buffer layer 140a is located between the first substrate 110a and the electrically conductive adhesion layer 300a. The electrically conductive structure a1 and the electrically conductive structure a2 penetrate the second insulating layer I2a, the first insulating layer I1a, the gate insulating layer GIa, the first substrate 110a and the buffer layer 140a. The electrically conductive structure a1 and the electrically conductive structure a2 respectively have larger widths in the buffer layer 140a than in the first substrate 110a, thereby enabling the red light emitting layer RL and the green light emitting layer GL to be more effectively electrically connected to the pixel circuit substrate 100b.

In the present embodiment, the electrically conductive structure a1 and the electrically conductive structure a2 are exemplified by single-layer structures. However, the disclosure is not limited thereto. In other embodiments, the electrically conductive structure a1 and the electrically conductive structure a2 may be multilayer structures.

The pixel circuit substrate 100b includes a first substrate 110b, the green sub-pixel circuit 122G and an electrically conductive structure b1. The green sub-pixel circuit 122G is located on the first substrate 110b.

In the present embodiment, the green sub-pixel circuit 122G includes an active device Tb and other wires (e.g., scan lines and data lines).

The active device Tb includes a channel layer CHb, a gate GAb, a source Sb and a drain Db.

The gate GAb overlaps the channel layer CHb, and a gate insulating layer GIb is sandwiched between the gate GAb and the channel layer CHb. A first insulating layer I1b covers the gate GAb. The source Sb and the drain Db are located on the first insulating layer I1b and are electrically connected to the channel layer CHb. In the present embodiment, the gate GAb is electrically connected to a scan line (not shown), and the source Sb is electrically connected to a data line (not shown). A second insulating layer I2b covers the first insulating layer I1b.

In the present embodiment, the green light emitting layer GL is electrically connected to the active device Tb via the electrically conductive structure a1. The red light emitting layer RL is electrically connected to the electrically conductive structure b1. An active device for controlling the red light emitting layer RL and the blue light emitting layer BL is not located in the pixel circuit substrate 100b.

In the present embodiment, the pixel circuit substrate 100b further includes a buffer layer 140b. The buffer layer 140b is located between the first substrate 110b and the electrically conductive adhesion layer 300b. The electrically conductive structure b1 penetrates the second insulating layer I2b, the first insulating layer I1b, the gate insulating layer GIb, the first substrate 110b and the buffer layer 140b. The electrically conductive structure b1 has a larger width in the buffer layer 140b than in the first substrate 110b, thereby enabling the red light emitting layer RL to more effectively be electrically connected to the pixel circuit substrate 100c.

In the present embodiment, the electrically conductive structure b1 is exemplified by a single-layer structure. However, the disclosure is not limited thereto. In other embodiments, the electrically conductive structure b1 may be a multilayer structure.

The pixel circuit substrate 100c includes a first substrate 110c and the red sub-pixel circuit 122R. The red sub-pixel circuit 122R is located on the first substrate 110c.

In the present embodiment, the red sub-pixel circuit 122R includes an active device Tc and other wires (e.g., scan lines and data lines).

The active device Tc includes a channel layer CHc, a gate GAc, a source Sc and a drain Dc.

The gate GAc overlaps the channel layer CHc, and a gate insulating layer GIc is sandwiched between the gate GAc and the channel layer CHc. A first insulating layer I1c covers the gate GAc. The source Sc and the drain Dc are located on the first insulating layer I1c and are electrically connected to the channel layer CHc. In the present embodiment, the gate GAc is electrically connected to a scan line (not shown), and the source Sc is electrically connected to a data line (not shown). A second insulating layer I2c covers the first insulating layer I1c.

In the present embodiment, the red light emitting layer RL is electrically connected to the active device Tc via the electrically conductive structure b1 and the electrically conductive structure a2. An active device for controlling the green light emitting layer GL and the blue light emitting layer BL is not located in the pixel circuit substrate 100c.

In the present embodiment, the pixel circuit substrate 100c further includes a buffer layer 140c. The buffer layer 140c is located between the first substrate 110c and the electrically conductive adhesion layer 300c.

The positions of the red sub-pixel circuit 122R, the green sub-pixel circuit 122G and the blue sub-pixel circuit 122B may be adjusted as needed. In the present embodiment, an example is given in which the pixel circuit substrate 100a including the blue sub-pixel circuit 122B is further away from the driver circuit substrate 200 than the pixel circuit substrate 100c including the red sub-pixel circuit 122R. However, the disclosure is not limited thereto. In other embodiments, the pixel circuit substrate 100c including the red sub-pixel circuit 122R and the pixel circuit substrate 100a including the blue sub-pixel circuit 122B may swap positions. In other words, the positions of the pixel circuit substrate 100a, the pixel circuit substrate 100b and the pixel circuit substrate 100c may be adjusted according to actual needs.

Based on the above, by disposing the sub-pixel circuit in different pixel circuit substrates, a larger layout space can be provided to the sub-pixel circuit, and the resolution can thereby be increased.

Figure 4:
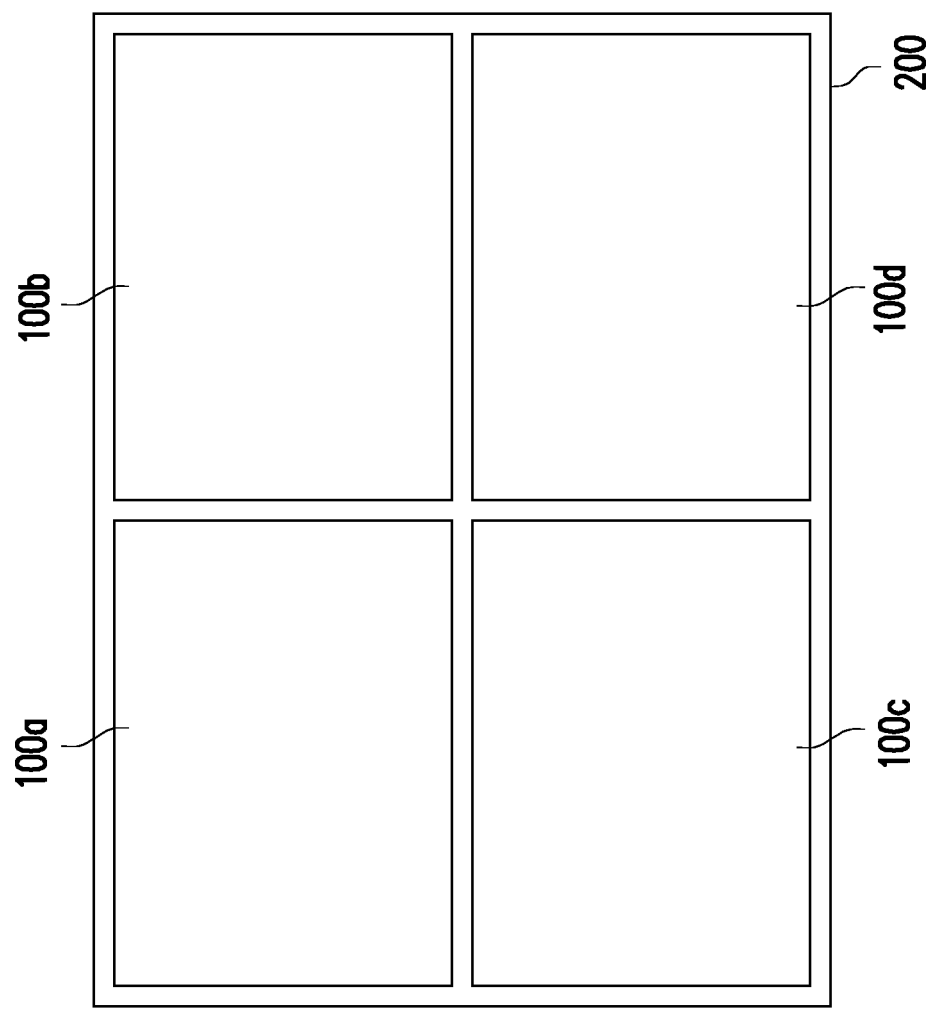
FIG. 4 is a schematic top view of a display device according to an embodiment of the disclosure.

FIG. 4 is a schematic top view of a display device according to an embodiment of the disclosure. It should be noted that the reference numerals and a part of the content of the embodiment of FIG. 1A to FIG. 1C are used in the embodiment of FIG. 4, in which the same or similar reference numerals denote the same or similar elements, and repeated description of the same technical content is omitted. For the description of the omitted parts, reference can be found in the aforementioned embodiment and the description will not be repeated here.

A main difference between a display device 10b of FIG. 4 and the display device 10 of FIG. 1C lies in that, the display device 10b includes a plurality of pixel circuit substrates (e.g., the pixel circuit substrate 100a, the pixel circuit substrate 100b, the pixel circuit substrate 100c and a pixel circuit substrate 100d).

Referring to FIG. 4, in the present embodiment, the pixel circuit substrate 100a, the pixel circuit substrate 100b, the pixel circuit substrate 100c and the pixel circuit substrate 100d are electrically connected to the same driver circuit substrate 200. The pixel circuit substrate 100a, the pixel circuit substrate 100b, the pixel circuit substrate 100c and the pixel circuit substrate 100d are, for example, located on the same plane.

In summary, the driver circuit substrate of the display device is located on the back side of the pixel circuit substrate, thereby allowing the display device to have advantages of a narrow border or even no border. In addition, since the pixel circuit and the driver circuit in the present embodiment are respectively fabricated on the first substrate and the second substrate, the difficulty of manufacturing the display device can be reduced.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A display device, comprising: a plurality of pixel circuit substrates, wherein the pixel circuit substrates overlap each other; a plurality of light emitting devices electrically connected to at least one of the pixel circuit substrates; a driver circuit substrate located on a back side of the pixel circuit substrates in a manner of being parallel to the pixel circuit substrates; a plurality of connection terminals electrically connecting the driver circuit substrate to the pixel circuit substrates; and at least one electrically conductive adhesion layer located between the pixel circuit substrates and the driver circuit substrate, wherein each of the pixel circuit substrates comprises: a first substrate, wherein the plurality of connection terminals penetrate the first substrate; and a plurality of pixel circuits located on the first substrate and electrically connected to the plurality of connection terminals.

2. The display device according to claim 1, wherein the driver circuit substrate comprises: a second substrate; and a driver circuit located on the second substrate, wherein the driver circuit comprises a plurality of driving units.

3. The display device according to claim 2, wherein the pixel circuit substrate comprises a plurality of pixel circuits arranged in a plurality of columns and a plurality of rows, and each row of the plurality of pixel circuits is disposed corresponding to one of the plurality of driving units.

4. The display device according to claim 2, wherein the pixel circuit substrate comprises a plurality of pixel circuits arranged in a plurality of columns and a plurality of rows, and each row of the plurality of pixel circuits is disposed corresponding to one or more of the driving units.

5. The display device according to claim 4, wherein the driving units corresponding to the plurality of pixel circuits in the same row generate the same driving signal.

6. The display device according to claim 1, wherein each of the plurality of pixel circuits comprises a blue sub-pixel circuit, a red sub-pixel circuit and a green sub-pixel circuit, and the plurality of connection terminals are located in the blue sub-pixel circuits.

7. The display device according to claim 1, wherein the at least one electrically conductive adhesion layer comprises a plurality of electrically conductive adhesion layers, and each of the pixel circuit substrates further comprises a buffer layer located between the first substrate and one of the electrically conductive adhesion layers, wherein the plurality of connection terminals penetrate the buffer layer, and the plurality of connection terminals have a larger width in the buffer layer than in the first substrate.

* * * * *